(12) United States Patent
Leibiger et al.

(10) Patent No.: US 6,972,472 B1
(45) Date of Patent: Dec. 6, 2005

(54) QUASI SELF-ALIGNED SINGLE POLYSILICON BIPOLAR ACTIVE DEVICE WITH INTENTIONAL EMITTER WINDOW UNDERCUT

(75) Inventors: Steven M. Leibiger, Falmouth, ME (US); Daniel J. Hahn, Portland, ME (US); Laurence M. Szendrei, Gray, ME (US)

(73) Assignee: Fairchild Semiconductor Corporation, Portland, ME (US)

( * ) Notice: Subject to any disclaimer, the term of this patent is extended or adjusted under 35 U.S.C. 154(b) by 0 days.

(21) Appl. No.: 10/395,460

(22) Filed: Mar. 24, 2003

Related U.S. Application Data

(60) Provisional application No. 60/369,434, filed on Apr. 2, 2002.

(51) Int. Cl.$^7$ ............................................. H01L 29/00
(52) U.S. Cl. .................. 257/517; 438/20; 438/322; 438/339
(58) Field of Search .................. 438/322; 257/12, 257/13, 79, 197

(56) References Cited

U.S. PATENT DOCUMENTS

| | | | |
|---|---|---|---|
| 4,157,269 A * | 6/1979 | Ning et al. | 438/359 |
| 4,252,582 A | 2/1981 | Anantha et al. | |
| 4,318,751 A | 3/1982 | Horng | |
| 4,691,436 A | 9/1987 | Hirao | |
| 5,106,767 A | 4/1992 | Comfort et al. | |
| 5,422,303 A * | 6/1995 | Klose et al. | 438/359 |
| 5,516,710 A * | 5/1996 | Boyd et al. | 438/309 |
| 5,523,244 A * | 6/1996 | Vu et al. | 438/366 |
| 5,668,396 A * | 9/1997 | Sato | 257/517 |
| 6,010,918 A * | 1/2000 | Marino et al. | 438/20 |
| 6,514,422 B2 * | 2/2003 | Huang et al. | 216/11 |

* cited by examiner

*Primary Examiner*—Thao P. Le
(74) *Attorney, Agent, or Firm*—Edwin H. Paul, Esq.; Cesari and McKenna, LLP

(57) ABSTRACT

An emitter stack for a quasi-self-aligned bipolar (NPN or PNP) transistor is formed where two layers over the emitter of a silicon substrate are windowed in a manner to under cut the top layer thereby exposing the substrate material. The emitter polysilicon structure is then formed over the window and conformally extends into the undercut region thereby widening the emitter region and so reducing the distance between the edge of the emitter and the extrinsic base (the base link distance) and therefore reducing the total base resistance of the transistor.

6 Claims, 2 Drawing Sheets

AFTER SALICIDE FORMATION

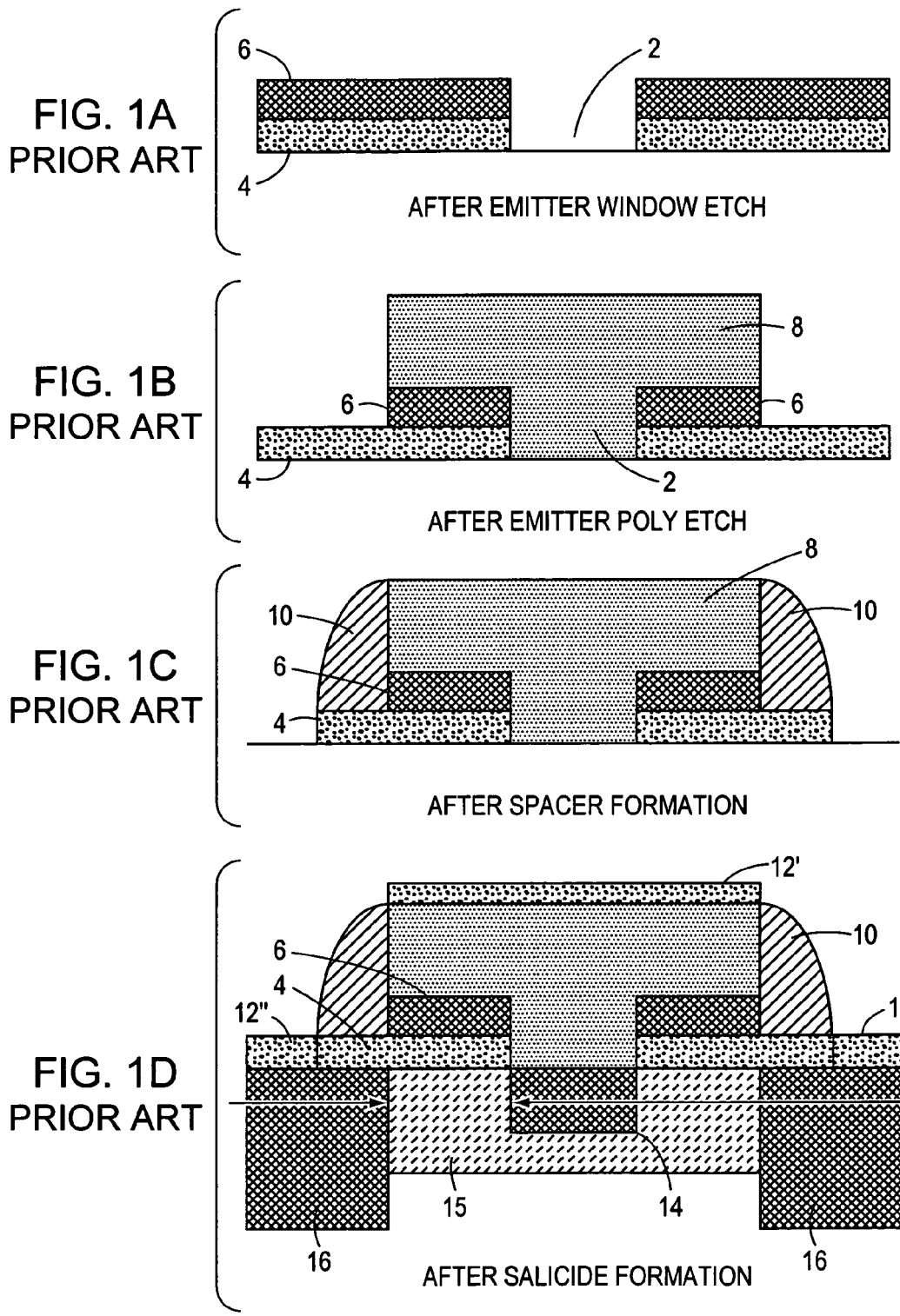

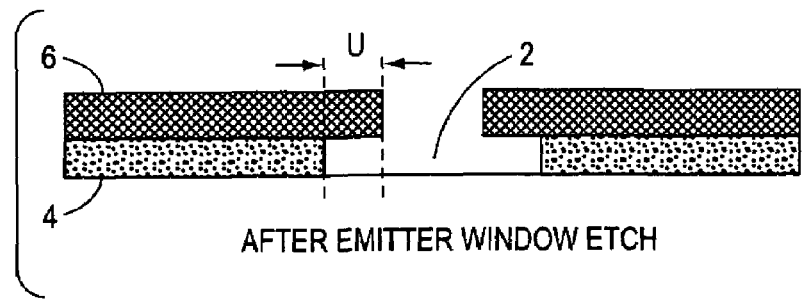
FIG. 2A — AFTER EMITTER WINDOW ETCH
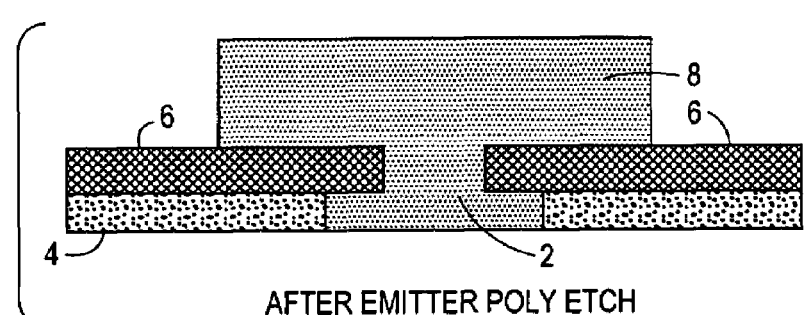
FIG. 2B — AFTER EMITTER POLY ETCH
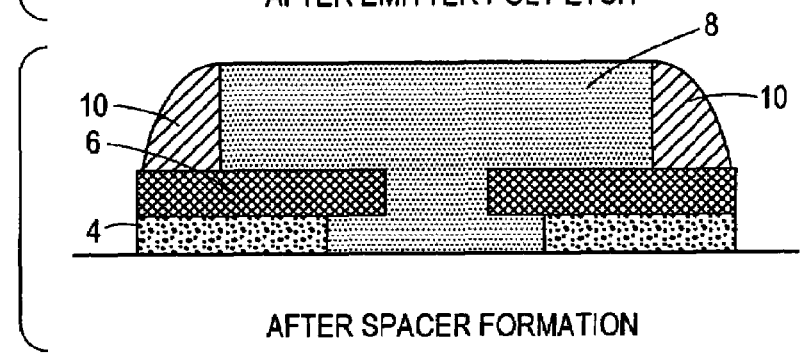
FIG. 2C — AFTER SPACER FORMATION
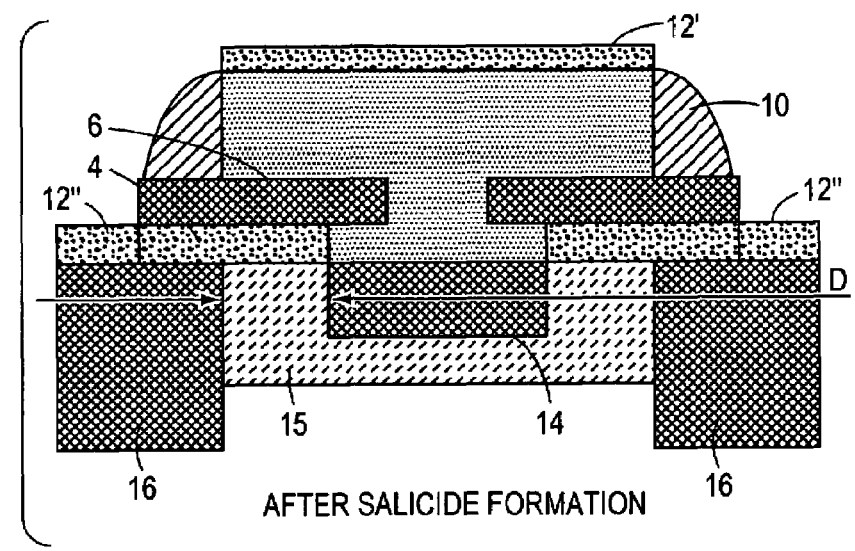
FIG. 2D — AFTER SALICIDE FORMATION

QUASI SELF-ALIGNED SINGLE POLYSILICON BIPOLAR ACTIVE DEVICE WITH INTENTIONAL EMITTER WINDOW UNDERCUT

CROSS-REFERENCE TO RELATED APPLICATIONS

The present application claims the benefit of U.S. Provisional Patent Application Ser. No. 60/369,434 which was filed on Apr. 2, 2002, of common inventorship and title as this application, and which provisional application is hereby incorporated herein by reference. The present application is also related to a divisional application. Ser. No. 10/889,329, filed Jul. 12, 2004, and expressly abandoned on Jun. 29, 2005. This divisional has common title, inventorship and ownership with the present application and is hereby incorporated herein by reference.

BACKGROUND OF THE INVENTION

1. Field of the Invention

The present invention relates to a process for fabricating bipolar active devices, and more particularly for bipolar transistors using polysilicon emitter contacts that are quasi-self-aligned (QSA) to the base region.

2. Background Information

A low base resistance in bipolar NPN or PNP transistors enhances that transistor's performance as is well known in the art. A significant part of the base resistance is the lateral "base link" between the low resistance extrinsic base region and the intrinsic transistor base. Consequently there have been inventions and patents that disclose processes and or other techniques that are intended to reduce transistor base resistance by reducing the length of the base link resistor.

One such process is disclosed in U.S. Pat. No. 4,157,269 to Ning et al. This patent discloses a fully self-aligned double poly transistor where the same mask opening is used to form the extrinsic base region and the emitter opening. The patent describes various techniques of doing this using the emitter and base poly layers as diffusion sources and allowing intentional undercut of the emitter stack to create space between the base poly and the emitter poly. The undercut is achieved by using an anisotropic etch step in contrast to the isotropic etch used to make non-undercut, vertical openings. This self-aligning allows the distance between the base and the emitter contacts to be reduced, and therefore reduces the resistance between them, that is the base resistance is reduced. The self-aligning feature eliminates the use of separate masks for the base and the emitter. Separate masks must take into account the inherent misalignment and photolithography overlays that result in a relatively long distance between the base and the emitter regions and therefore higher base resistances. Note that in this invention, the intentional stack etch undercut is used to space the top stack layer, used as an etch hard mask, from the bottom stack layer, which is the poly base contact.

Another prior art invention is disclosed in U.S. Pat. No. 5,4220,303 by Klose et al. This patent discloses a fully self-aligned emitter base structure using a selectively grown epitaxial base layer. After etching of the emitter stack, one of the stack layers is intentionally undercut by an anisotropic etch. This undercut allows the subsequently grown epi base to form both the intrinsic and base link base regions. The intrinsic base corresponds to the original non-undercut emitter opening, and the link is the epi grown in the undercut space. This technique allows the base link resistor to be very short. Note that in this invention, the intentional emitter stack undercut is used to create room for growth of the intrinsic and base link epi film.

The present invention improves on the known prior art by integrating a short base link resistor into a QSA bipolar process flow using an intentional undercut of one of the emitter stack layers in a novel way.

FIGS. 1A–1D show a typical bipolar QSA emitter process flow, well know by those skilled in the art. The first step in FIG. 1A shows the emitter window 2 etched into a thin film stack consisting of an oxide 4 and a nitride layer 6. A polysilicon (poly) emitter is next formed over the window 2 and overlapping the nitride layer. FIG. 1B shows the etched poly surface 8. Note that the nitride layer 6 is also etched, but that the oxide layer 4 is not. Oxide spacers 10 are formed over the edges of the poly emitter 8 and onto the oxide layer 4. The oxide layer 4 is etched away outside of the spacers in a self-aligned manner (during the spacer etch) leaving the emitter stack as shown in FIG. 1C. Then a salicide (self-aligned silicide) layer 12' and 12" is formed over the surfaces of the emitter 8 and the silicon substrate 16. The spacers 10 prevent the emitter salicide 12' from shorting to the substrate (extrinsic base) salicide layer 12".

The final transistor structure is shown in FIG. 1D. This structure shows the doped N+transistor emitter 14, the P– intrinsic base 15, and the P+ extrinsic base regions 16 on either side of the P– intrinsic base 15. A significant potion of the transistor base resistance is determined the distance D as shown. This distance is determined by the alignment and dimensional tolerances between the definition of the emitter window edge and the emitter polysilicon contact edge. Equipment technology improvements allow this distance to be reduced, but never eliminated.

SUMMARY OF THE INVENTION

In view of the foregoing background discussion, the present invention provides for a smaller distance from the edge of the QSA emitter window to the edge of the polysilicon emitter contact than would normally be permitted for a given equipment base. This leads to a reduction of transistor base resistance and a corresponding improvement in transistor operating characteristics.

An emitter stack for a QSA bipolar transistor is formed where two insulating layers over the emitter of a silicon substrate are windowed in a manner to under cut the top layer thereby exposing more surface area of the substrate material compared to windowing with no undercutting. The emitter polysilicon structure is then formed over the window where it conformally extends into the undercut region thereby widening the emitter region and so reducing the distance between the edge of the emitter hole and the extrinsic base which is self aligned to the edge of the poly emitter contact.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIGS. 1A–1D are diagrams of a QSA emitter structure used in the prior art; and

FIGS. 2A–2D are diagrams of an embodiment of a QSA emitter structure formed using the present invention.

DETAILED DESCRIPTION OF AN ILLUSTRATIVE EMBODIMENT

FIGS. 2A–2D show an emitter stack formed using one embodiment of the present invention. The process to form the last structure shown in FIG. 2D is similar to that used in FIG. 1D except that the etching of the emitter window 2 purposely undercuts the nitride layer 6. The oxide layer 4 is etched away by a distance U, FIG. 2A, under the nitride layer 6.

FIG. 2A shows the structure after the emitter window 2 etch. Note the undercut U of the oxide layer 4 relative to the nitride layer 6. FIG. 2B shows a poly layer that is deposited over the entire surface and then etched to form the transistor emitter 8, covering the emitter window 2. Note the important detail that the poly deposition is able to completely fill the void under the nitride layer 6 formed by the intentional undercut of the oxide layer 4. This conformal deposition is a property of polysilicon film growth. The polysilicon emitter contact is next etched, as shown in FIG. 2B. In contrast to the prior art shown in FIG. 1B, the nitride layer 6 is not etched during this step. FIG. 2C shows the result after the oxide spacers 10 are formed. During the spacer formation the nitride and oxide layers extending beyond the spacers are removed in a self-aligned manner. FIG. 2D shows the structure after salicide layers 12' and 12" are formed over the surfaces.

FIGS. 2A–2D use process steps very similar to those in FIGS. 1A–1D, but where the structure of the NPN transistor that is last formed shows a wider emitter region 14' than the emitter 14 region in FIG. 1D. This results in a shorter base link resistor distance D'. This reduces the total base resistance as compared to the bipolar transistor of FIG. 1, all else being the same for the structures in FIGS. 1A–1D and 2A–2D.

Using the approach shown in FIGS. 2A–2D the top stack layer will be one photo alignment wide from the edge of the emitter window to the poly edge. The bottom stack layer will be one photo alignment wide from the emitter window opening to the spacer edge, but less than one photo alignment from the emitter window to the poly edge. Thus, the critical distance from the edge of the active emitter to the edge of the extrinsic base region is reduced, resulting in reduced base resistance in the final transistor.

It is well known in the art to form such substrates, layer and emitter regions in silicon. The photographic masking, etching, growing, diffusing, and other chemical, photographic, and mechanical skills, techniques and processes needed to practice the present invention are well known in the art.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An emitter stack of a quasi-self-aligned bipolar transistor comprising:
    a first insulating layer over the emitter location of a silicon substrate,
    a second insulating layer over the first insulating layer at the emitter location,
    a window through the first and the second insulating layer to the emitter location,
    means for undercutting the second insulating by differentially etching away the first insulating layer beneath the second insulating layer thereby exposing the silicon substrate,
    an emitter material conformally formed on the exposed silicon substrate, and
    an electrical contact to the emitter material.

2. The emitter stack of claim 1 further comprising an insulator spacer isolating the emitter stack.

3. The emitter stack of claim 2 wherein the spacers and the first insulating layer are oxides and the second insulating layer is a nitride, and where the emitter material is polysilicon and the electrical contact is a salicide.

4. A quasi-self-aligned process for building an emitter stack of a bipolar (NPN or PNP) transistor comprising the steps of:
    forming a first insulating layer over the emitter location of a silicon substate,
    forming a second insulating layer over the first insulating layer at the emitter location,
    opening a window through the first and the second insulating layer to the emitter location,
    undercutting the second insulating by differentially etching away the first insulating layer beneath the second insulating layer,
    conformally forming an emitter material on the exposed silicon substrate, and forming an electrical contact to the emitter material.

5. The process of claim 4 further comprising the step of forming an insulator spacer isolating the emitter stack.

6. The process of claim 5 wherein the spacers and the first insulating layer are oxides and the second insulating layer is a nitride, and where the emitter material is polysilicon and the electrical contact is a salicide.

* * * * *